(12) United States Patent
Hirose

(10) Patent No.: US 6,476,465 B2
(45) Date of Patent: Nov. 5, 2002

(54) INTEGRATED CIRCUIT PACKAGE FOR MOUNTING

(75) Inventor: Tatsuya Hirose, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/814,759

(22) Filed: Mar. 23, 2001

(65) Prior Publication Data

US 2001/0045626 A1 Nov. 29, 2001

(30) Foreign Application Priority Data

May 2, 2000 (JP) ........................................ 2000-133537

(51) Int. Cl.$^7$ ............................................. H01L 23/495
(52) U.S. Cl. ...................... 257/666; 257/772; 257/773; 257/774; 257/778
(58) Field of Search ................................. 257/659, 664, 257/680, 698, 737, 778, 788

(56) References Cited

U.S. PATENT DOCUMENTS 6,097,097 A  *  8/2000  Hirose ......................... 257/778
6,294,837 B1  *  9/2001  Akram et al. ................ 257/774

* cited by examiner

Primary Examiner—David Nelms
Assistant Examiner—Mai-Huong Tran
(74) Attorney, Agent, or Firm—Staas & Halsey LLP

(57) ABSTRACT

In an integrated circuit package, a resistance film as an electric resistance part which is electrically independent is provided on a dielectric substrate at an opposed position to an integrated circuit chip. A thickness of the substrate is specified to be almost a quarter of a signal wavelength which is decided by a frequency used in an integrated circuit of the chip and the specific inductive capacity of the substrate, and the surface resistance value of the resistance film is specified to become equal to the characteristic impedance of air. Being structured as above, an unnecessary electromagnetic wave which is emitted from the integrated circuit of the integrated circuit chip is absorbed with extremely high efficiency, and stabilization of the operation of a circuit can be realized.

20 Claims, 9 Drawing Sheets

INTEGRATED CIRCUIT PACKAGE FOR MOUNTING

CROSS-REFERENCE TO RELATED APPLICATIONS

This application is based upon and claims priority of Japanese Patent Application No. 2000-133537, filed on May 2, 2000, the contents being incorporated herein by reference.

BACKGROUND OF THE INVENTION

1. Field of the Invention

This invention relates to integrated circuit packages mainly for flip-chip mounting.

2. Description of the Related Art

As conventional integrated circuit packages for flip-chip bonding, there are a type in which a grounded metallic film 103 exists right under an integrated circuit chip 101 to be flip-chip mounted onto a dielectric substrate 102 as shown in FIGS. 13A and 13B, or a type in which a surface of the dielectric substrate 102 is unprotected right under the integrated circuit chip 101 as shown in FIGS. 14A and 14B. FIG. 13B and FIG. 14B are sectional views showing the structures taken along the I—I line in FIG. 13A and the II—II line in FIG. 14A, respectively.

These integrated circuit packages are structured to be provided with the grounded metallic film 103 on the dielectric substrate 102, lead-out wirings 104, 105 for leading out a high frequency signal to the outside, power supply wirings 106 to 109 and a pad 111 for connecting with a projecting metal 110 which is provided on the integrated circuit chip 101 for flip-chip mounting, as shown in FIG. 13 and FIG. 14.

Moreover, the thickness of the dielectric substrate 102 can be freely decided in the conventional integrated circuit package.

The integrated circuit package generally has a disadvantage that an unnecessary electromagnetic wave is generated and emitted at a surface of a circuit of the integrated circuit chip or parts such as a bump or a pillar for connecting the circuit and a wiring on the dielectric substrate. This is because an electric field laid between a signal line and a grounding conductor is forced to change at a discontinuous part, thereby causing a different transmission mode to occur.

The electromagnetic wave which is emitted to a gap is reflected by the grounded metallic film right under the chip or the unprotected surface of the dielectric substrate to enter into the various parts of a circuit pattern, which causes a problem that the operation of the circuit becomes unstable.

SUMMARY OF THE INVENTION

It is an object of the present invention to provide an integrated circuit package which absorbs an unnecessary electromagnetic wave emitted from an integrated circuit of an integrated circuit chip with extremely high efficiency and realizes stabilization of the operation of a circuit.

According to the first aspect of the present invention, an integrated circuit package with a dielectric substrate provided with a grounding conductor on its rear surface and an electric-electronic circuit of a patterned metallic film on its upper surface respectively and an integrated circuit chip being connected to oppose to each other, comprises an electric resistance part being electrically independent of the metallic film on the dielectric substrate at an opposed position to the integrated circuit chip.

In this aspect, in addition to the provision of the electric resistance part, the thickness of the dielectric substrate is controlled in view of effectively absorbing the electromagnetic wave.

More specifically, it is preferable to control the thickness to be almost a quarter of a desired signal wavelength to be absorbed, for example, the signal wavelength which is decided by a frequency used in the integrated circuit of the integrated circuit chip and the specific inductive capacity of the dielectric substrate, or to be within the range of one-eighth to one-half the signal wavelength.

Further, in consideration of absorbing signal wavelengths in a wide range or those within a predetermined range, it is preferable to process the opposed position of the dielectric substrate to be in a recessed and protruding shape. In this case, the electromagnetic waves within the predetermined range can be absorbed by continuously changing the thickness of the dielectric substrate, and the electromagnetic waves having predetermined wavelengths can be absorbed by discontinuously changing the same.

Moreover, in consideration of precisely and properly absorbing the electromagnetic wave, in this aspect, the electric resistance part is controlled to have a surface resistance value which is almost equal to the characteristic impedance between the electric resistance part and the dielectric substrate.

More specifically, when a gap is formed between the electric resistance part and the dielectric substrate, the surface resistance value is controlled to be equal to the characteristic impedance of air in the gap. It is also suitable to fill the gap with a predetermined dielectric substance in order to control the surface resistance value easily.

Further, in this aspect, in consideration of enhancing grounding of the integrated circuit of the integrated circuit chip, an insulation film is provided on the electric resistance part and a metallic conductor in the form of a mesh is provided thereon for electrically connecting with the integrated circuit.

Furthermore, in this aspect, in addition to the formation of the electric resistance part as a resistance film, it is suitable to form the electric resistance part by filling a groove with a resistance material which is formed at the opposed position on the dielectric substrate.

According to the second aspect of the present invention, an integrated circuit package similar to that in the first aspect, comprises an electric resistance part being electrically independent of a metallic film on a dielectric substrate at an opposed position to an integrated circuit chip, and the thickness of the dielectric substrate at the opposed position is specified so that a desired signal wavelength absorbed in the electric resistance part becomes an almost open end at a surface of the electric resistance part.

Also in this aspect, it is preferable to define the thickness of the dielectric substrate, change the thickness at the opposed position, regulate the surface resistance value of the electric resistance part and so on, similarly to that in the aforesaid first aspect.

In the integrated circuit package of the present invention, even when the electromagnetic wave of an unnecessary mode is generated, the electric resistance part which is provided on the dielectric substrate at the opposed position to the integrated circuit chip absorbs the electromagnetic wave without reflections in the opposed position. When the thickness of the grounded dielectric substrate is set to be one quarter of the signal wavelength which is decided by the frequency used in the integrated circuit and the specific inductive capacity of the dielectric substrate, a surface of the electric resistance part appears to be the electrically open end for the electromagnetic wave, so that an amplitude of a voltage due to the electromagnetic wave on the surface of the electric resistance part becomes maximum. Thereby, a current is generated on the surface of the electric resistance part because of the voltage by the electromagnetic wave, an energy loss is generated, and its value becomes maximum.

Further, the surface resistance value of the electric resistance part is made to coincide with the characteristic impedance decided by the relative permeability and the specific inductive capacity between a circuit pattern and the dielectric substrate, whereby a match between the characteristic impedance of the electromagnetic wave emitted to the gap and a characteristic impedance on the resistance film can be obtained and the energy is lost effectively.

Furthermore, when the thickness of the dielectric substrate is set to be within one-eighth to one-half the signal wavelength which is decided by the frequency used in the integrated circuit and the specific inductive capacity of the dielectric substance, it is possible to absorb the electromagnetic wave in a frequency range of a quarter of the signal wavelengths of the respective lengths.

According to the present invention, when the electric resistance part of a proper value is provided on the surface and a package substrate using the dielectric substrate of a proper thickness with its rear surface being grounded is used, the unnecessary electromagnetic wave which is emitted from the integrated circuit chip and the unnecessary electromagnetic wave which enters from the outside are removed with extremely high efficiency, which makes it possible to realize an integrated circuit module of high performance.

DETAILED DESCRIPTION OF THE PREFERRED EMBODIMENTS

Hereinafter, preferred embodiments of the present invention will be explained in detail with reference to drawings.

First Embodiment

Figure 1:
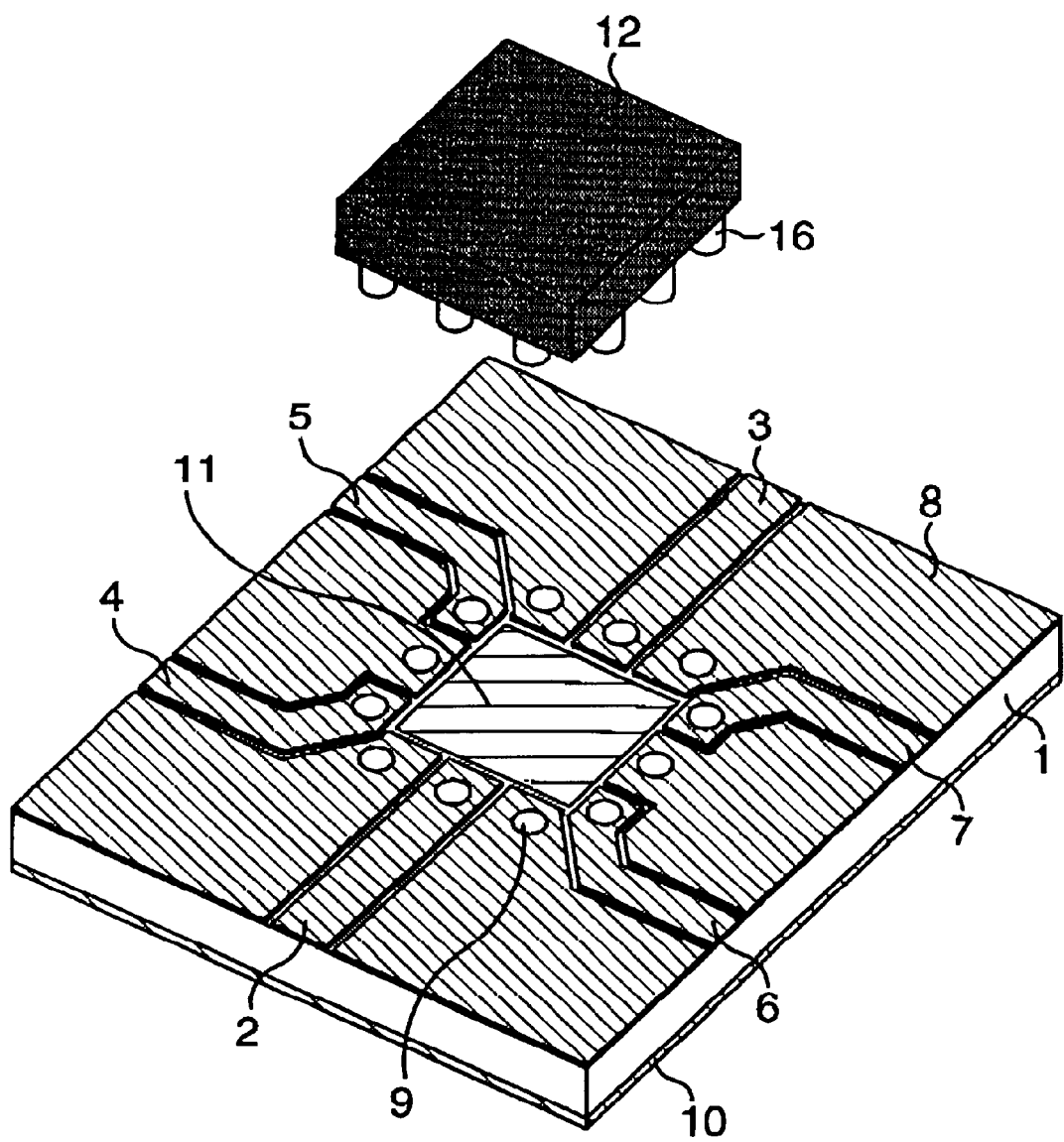
FIG. 1 is a schematic exploded perspective view of an integrated circuit package for flip-chip mounting according to the first embodiment of the present invention.

FIG. 1 is a schematic perspective view of an integrated circuit package for flip-chip mounting according to the first embodiment of the present invention.

In this integrated circuit package, signal wirings 2, 3 for electrically connecting with an integrated circuit of an integrated circuit chip 12, power supply wirings 4 to 7, a grounded metallic film 8 for grounding the integrated circuit, and a pad metal 9 for connecting with projecting metals 16 on the chip such as bumps and pillars in flip-chip mounting the integrated circuit chip 12 are provided on a side of a surface (upper surface) of a dielectric substrate 1 to be flip-chip mounted with the integrated circuit chip 12. Meanwhile, a grounding conductor 10 for establishing grounding to the outside is provided on a rear surface side of the dielectric substrate 1.

Moreover, at a position opposed to the integrated circuit chip 12 on the dielectric substrate 1, a resistance film 11 is provided as an electric resistance part which is electrically independent of its surroundings of the signal wirings 2, 3, the power wirings 4 to 7 and the grounded metallic film 8.

The thickness of the dielectric substrate 1 is specified to be almost one quarter of a desired signal wavelength, in this case a signal wavelength decided by a frequency used in the integrated circuit of the integrated circuit chip 12 and a specific inductive capacity of the dielectric substrate 1. It is also suitable to specify the thickness to be a predetermined value within a range of one-eighth to one-half the aforesaid signal wavelength.

Figure 2:
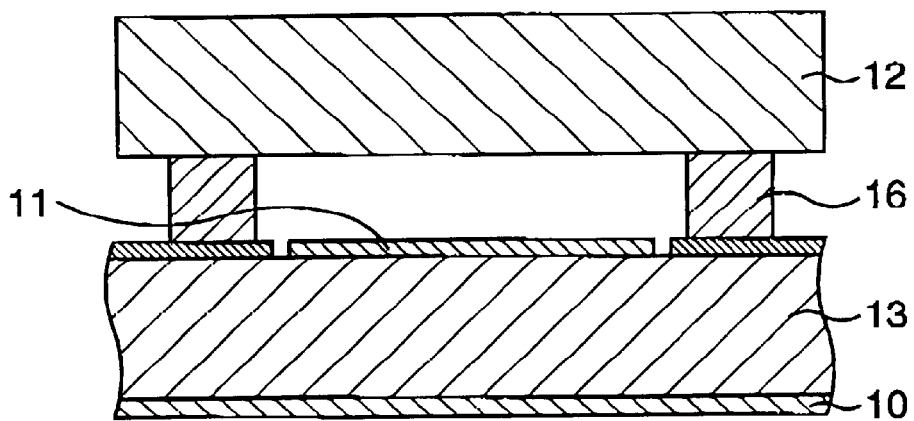
FIG. 2 is a schematic sectional view of the integrated circuit package according to the first embodiment.

FIG. 2 is a schematic sectional view of the integrated circuit package in which the integrated circuit chip 12 is flip-chip mounted onto the dielectric substrate 1.

A gap is formed between the integrated circuit chip 12 and the dielectric substrate 1, and in this embodiment, the surface resistance value of the resistance film 11 is specified in such a manner to become equal to the characteristic impedance of the aforesaid gap. That is, the surface resistance value of the resistance film 11 is set to be about 376.7 $\Omega/\square$ which is the characteristic impedance of air. For example, supposing that the integrated circuit chip 12 is driven by a frequency (f) of 80 GHz, a speed of light ($C_0$) is $3.0 \times 10^8$ m/s, and the specific inductive capacity ($\in_{eff}$) of the dielectric substrate 1 is 9, the signal wavelength in the dielectric substance is as follows:

$$\lambda/4 = c_0/\{4 \cdot f \cdot (\varepsilon_{e\!f\!f})^{1/2}\}$$
$$= 3.0 \times 10^8/(4 \times 80 \times 10^9 \times 3)$$
$$= 3.125 \times 10^{-4} (m)$$

Thus, the thickness of the dielectric substrate 1 should be about 312.5 $\mu$m.

Figure 3:
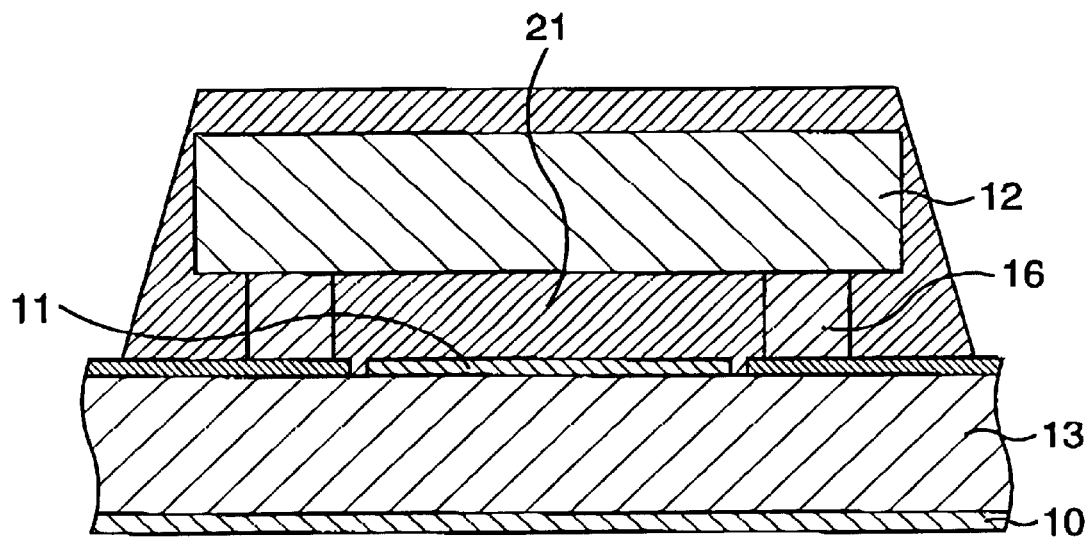
FIG. 3 is a schematic sectional view of another example of integrated circuit package according to the first embodiment.

Moreover, as shown in FIG. 3, it is also suitable to introduce a material 21 whose specific inductive capacity is larger than one between the integrated circuit chip 12 and the dielectric substrate 1. In this case, the surface resistivity R of the resistance film 11 can be calculated as follows:

$$R=\{(\mu_0 \cdot \mu_r)/(\in_0 \cdot \in_r)\}^{1/2}$$

where $\mu_0$ and $\in_0$ represent the permeability and the permittivity in vacuum and $\mu_r$ and $\in_r$ do the relative permeability and the specific inductive capacity of the material 21, respectively.

In the integrated circuit package of this embodiment, even when an electromagnetic wave of an unnecessary mode is generated, the resistance film 11 which is provided on the dielectric substrate 1 at the position opposed to the integrated circuit chip 12 absorbs the electromagnetic wave without reflections in the opposed position. When the thickness of the grounded dielectric substrate 1 is set to be one quarter of the signal wavelength which is decided by the frequency used in the integrated circuit and the specific inductive capacity of the dielectric substrate 1, a surface of the resistance film 11 appears to be an electrically open end for the electromagnetic wave, so that an amplitude of a voltage due to the electromagnetic wave on the surface becomes maximum. Thereby, a current is generated on the surface because of the voltage by the electromagnetic wave, an energy loss is generated, and its value becomes maximum.

Further, the surface resistance value of the resistance film 11 is made to coincide with the characteristic impedance decided by the relative permeability and the specific inductive capacity between a circuit pattern and the dielectric substrate 1, whereby a match between a characteristic impedance of the electromagnetic wave emitted to the gap and a characteristic impedance on the resistance film can be obtained and the energy is lost effectively.

Furthermore, when the thickness of the dielectric substrate 1 is set to be one-eighth to one-half the signal wavelength which is decided by the frequency used in the integrated circuit and the specific inductive capacity of the dielectric, it is possible to absorb the electromagnetic wave in a frequency range of a quarter of the signal wavelengths of the respective lengths.

Therefore, according to this embodiment, the unnecessary electromagnetic wave which is emitted from the integrated circuit of the integrated circuit chip 12 is absorbed with extremely high efficiency, and stabilization of the operation of the circuit can be realized.

Second Embodiment

Next, the second embodiment of the present invention will be explained. Similarly to the first embodiment, an integrated circuit package for flip-chip mounting will be exemplified, but there is a difference in a shape of an electric resistance part. Incidentally, the same numerals are given to the basic components and the like which are in common with the first embodiment and the description thereof will be omitted.

Figure 4:
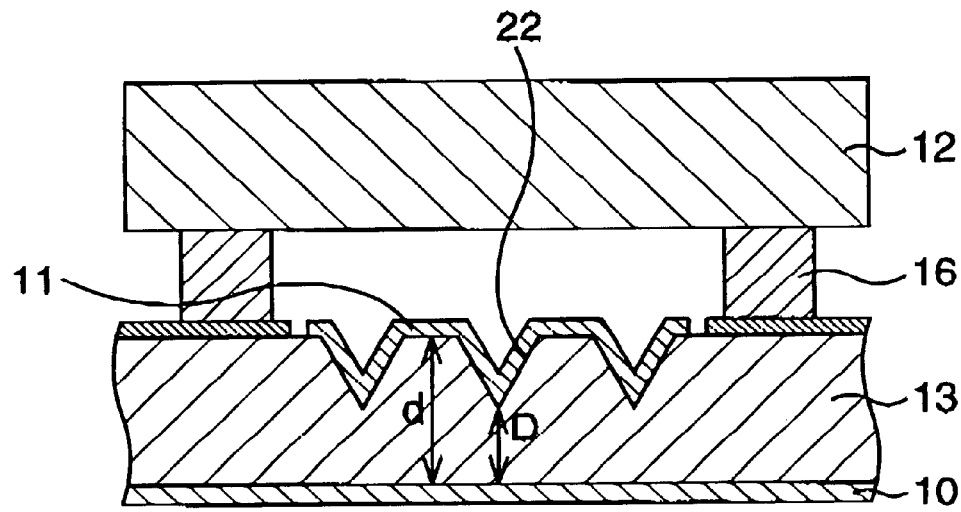
FIG. 4 is a schematic sectional view of an integrated circuit package for flip-chip mounting according to the second embodiment of the present invention.

FIG. 4 is a schematic sectional view of the integrated circuit package according to this embodiment.

The integrated circuit package is structured to form therein a recessed and protruding part 22 on a dielectric substrate 13 at a position opposed to an integrated circuit chip 12 so that the thickness of the dielectric substrate 13 continuously varies from point to point in the above opposed position.

A component of the lowest frequency of a signal to be absorbed is decided by a part d which is the thickest part of the dielectric substrate 13, and a component of the highest frequency is decided by a part D which is the thinnest part thereof. For example, supposing that the specific inductive capacity of the dielectric substrate 13 is nine, D is 300 $\mu$m and d is 400 $\mu$m, an electromagnetic wave can be absorbed in the frequency range from 62.5 GHz to 83.3 GHz.

According to this embodiment, in addition to the effects caused by the first embodiment, it is possible to absorb the electromagnetic wave in the wide frequency range because the thickness of the dielectric substrate 13 varies in the aforesaid opposed position.

It is also suitable that the values of D to d of the recessed and protruding part 22 are specified to include the range from one-eighth to one-half the signal wavelength which is decided by a frequency used in an integrated circuit of the integrated circuit chip 12 and the specific inductive capacity of the dielectric substrate 13. In this case, with reference to the above signal wavelength, it is structured to be able to correspond to the aforesaid range with one-quarter the signal wavelength in the middle.

Modification 1

Figure 5:
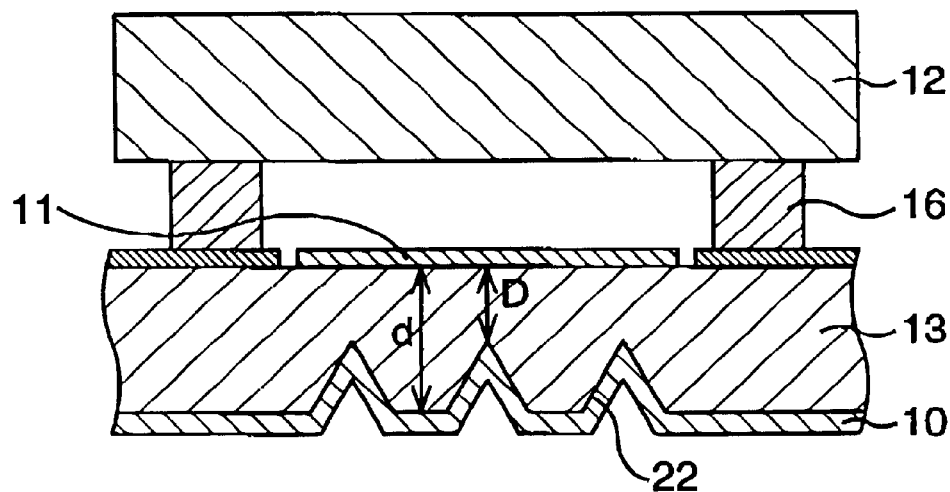
FIG. 5 is a schematic sectional view of the first modification of the integrated circuit package according to the second embodiment.

FIG. 5 is a schematic sectional view of the first modification of the integrated circuit package according to this embodiment.

In the integrated circuit package, the recessed and protruding part 22 is formed in a rear surface part of the dielectric substrate 13 which corresponds to the opposed position to change the thickness of the dielectric substrate 13 from point to point, and the resistance film 11 is formed on a flat upper surface thereof.

Being structured as above, in addition to the effects caused by the first embodiment, the absorption of the electromagnetic wave in the wide frequency range is made possible because the thickness of the dielectric substrate 13 varies in the aforesaid opposed position as in the example in FIG. 4, and what is more, it is possible to form the flat upper surface of the dielectric substrate 13 due to the formation of the recessed and protruding part 22 on its rear surface, and to specify the thickness of the dielectric substrate 13 easily and precisely.

Modification 2

Figure 6:
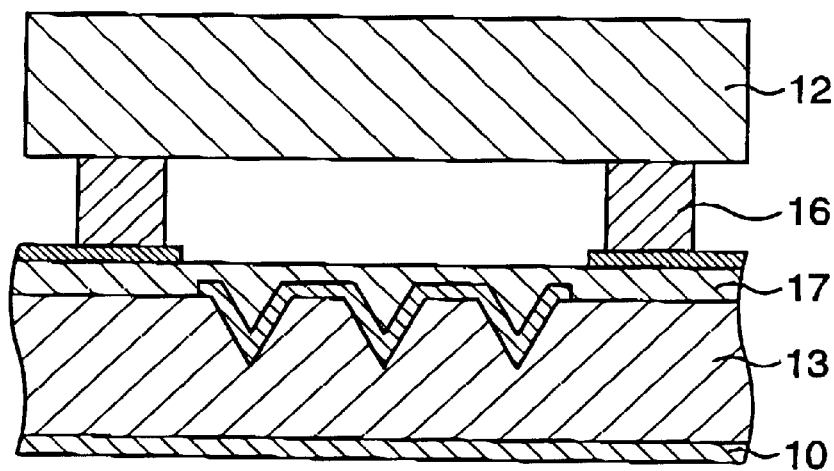
FIG. 6 is a schematic sectional view of the second modification of the integrated circuit package according to the second embodiment.

FIG. 6 is a schematic sectional view of the second modification of the integrated circuit package according to this embodiment.

In the integrated circuit package, an insulation film for surface flattening, in concrete, for example, a BCB (Benzo Cyclo Btene) film 17 available from Dow Chemical Company is used for coating the surface of the dielectric substrate 13 on which the resistance film 11 is formed, and signal wirings 2, 3 for electrically connecting with the integrated circuit chip 12, power wirings 4 to 7, a grounding conductor 8 for grounding and a pad metal 9 are provided thereon.

Being structured as above, in addition to the effects caused by the first embodiment, the absorption of the electromagnetic wave in the wide frequency range is made possible because the thickness of the dielectric substrate 13 varies in the aforesaid opposed position as in the example in FIG. 4, and what is more, the upper surface of the aforesaid opposed position of the dielectric substrate 13 is flattened by the BCB film 17, and it is possible to specify the thickness of the dielectric substrate 13 easily and precisely.

Modification 3

Figure 7:
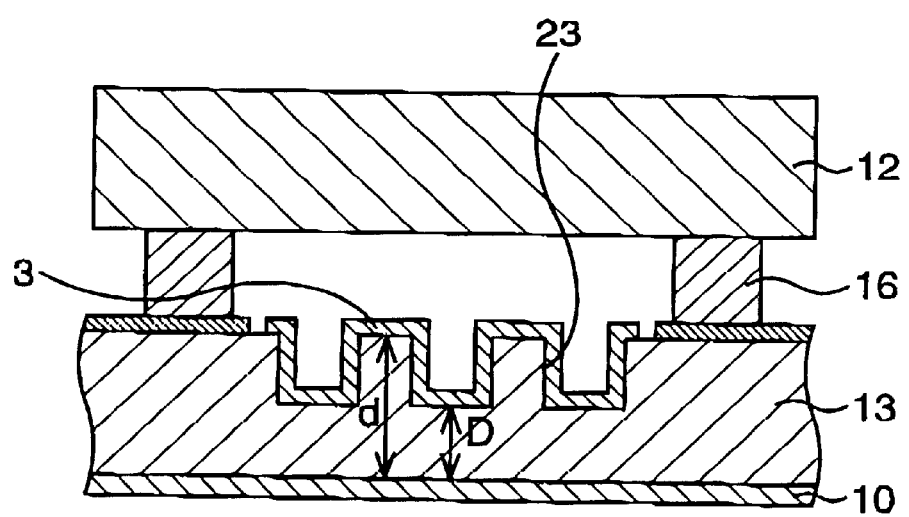
FIG. 7 is a schematic sectional of the third modification of the integrated circuit package according to the second embodiment.

FIG. 7 is a schematic sectional view of the third modification of the integrated circuit package according to this embodiment.

In this integrated circuit package, a recessed and protruding part 23 whose processed cross section has a rectangular shape is formed on the dielectric substrate 13 at a position opposed to the integrated circuit chip 12. In this case, a frequency of the electromagnetic wave which can be absorbed is decided in an almost discontinuous (discrete) manner by the thickness d, D in the recessed and protruding part 23 of the dielectric substrate 13. For example, supposing that D is 300 $\mu$m and d is 400 $\mu$m, it is possible to absorb the electromagnetic waves only at the frequency near 62.5 GHz and at the frequency near 83.5 GHz and not to absorb the electromagnetic waves of the frequencies other than the above.

Being structured as above, in addition to the effects caused by the first embodiment, the proper absorption can be operated by concentrating on the electromagnetic waves of the two predetermined frequencies.

Modification 4

Figure 8:
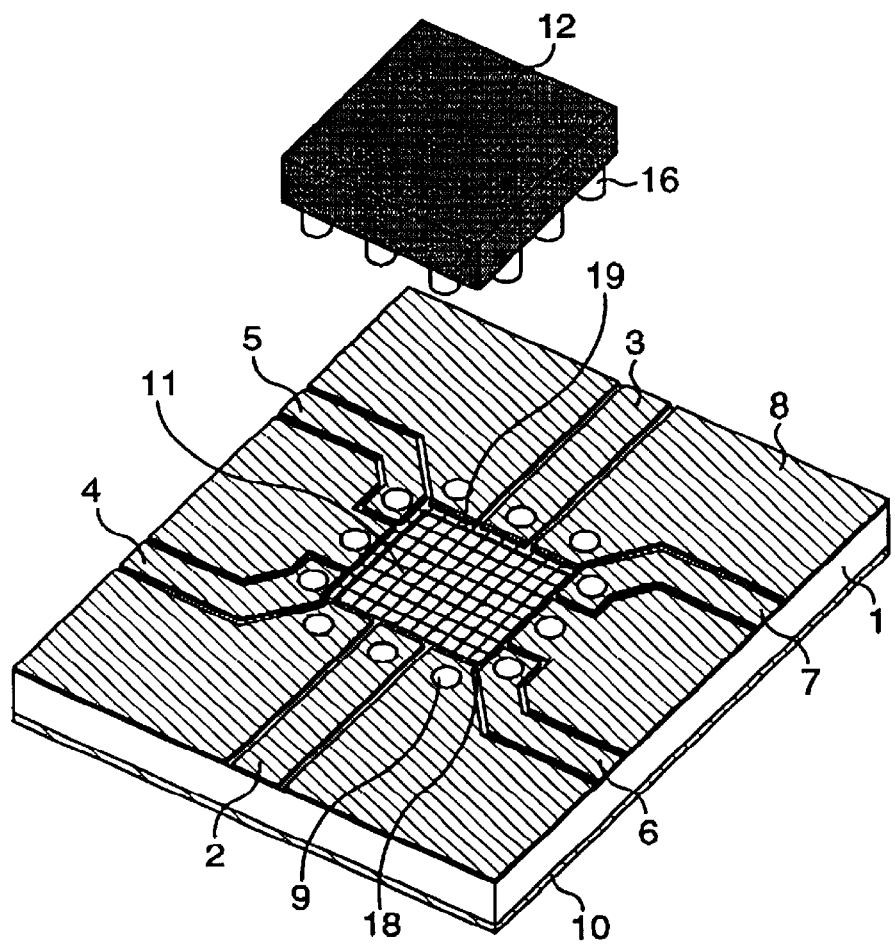
FIG. 8 is a schematic exploded perspective view of the fourth modification of the integrated circuit package according to the second embodiment.

FIG. 8 is a schematic perspective view of the fourth modification of the integrated circuit package according to this embodiment.

In the integrated circuit package, a thin insulation film 18, for example, a polyimide film with a film thickness of about 10 $\mu$m is formed on the resistance film 11, and further a metallic conductor 19 for grounding is formed thereon in a shape of a mesh, and the metallic conductor 19 for grounding is connected to projecting metals 16 such as pillars and bumps for grounding in the integrated circuit chip 12.

Being structured as above, in addition to the effects caused by the first embodiment, grounding of the integrated circuit in the integrated circuit chip 12 can be further strengthened.

Modification 5

Figure 9:
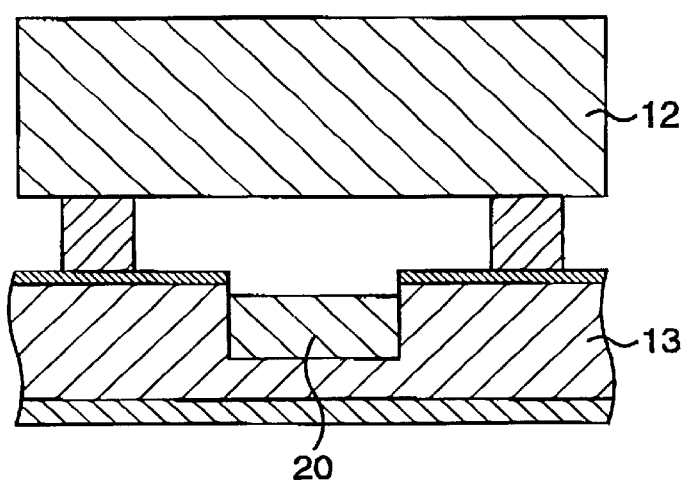
FIG. 9 is a schematic sectional view of the fifth modification of the integrated circuit package according to the second embodiment.

FIG. 9 is a schematic sectional view of the fifth modification of the integrated circuit package according to this embodiment.

In the integrated circuit package, instead of forming the resistance film at the opposed position of the dielectric substrate 13, a groove 24 is formed at the opposed position of the dielectric substrate 13, and the groove 24 is filled with a resistance material such as a resin resistance material 20 including ferrite powder to make an electric resistance part.

Being structured as above, in addition to the effects caused by the first embodiment, the material with high volume resistivity can be utilized because the resistance material is put into the deep groove.

Third Embodiment

Next, the third embodiment of the present invention will be explained. Similarly to the first embodiment, an integrated circuit package for flip-chip mounting will be exemplified, but a difference is that a measure is taken against an electromagnetic wave entering into the integrated circuit package from the outside thereof. Incidentally, the same numerals are given to the basic components and the like which are in common with the first embodiment and the description thereof will be omitted.

Figure 10:
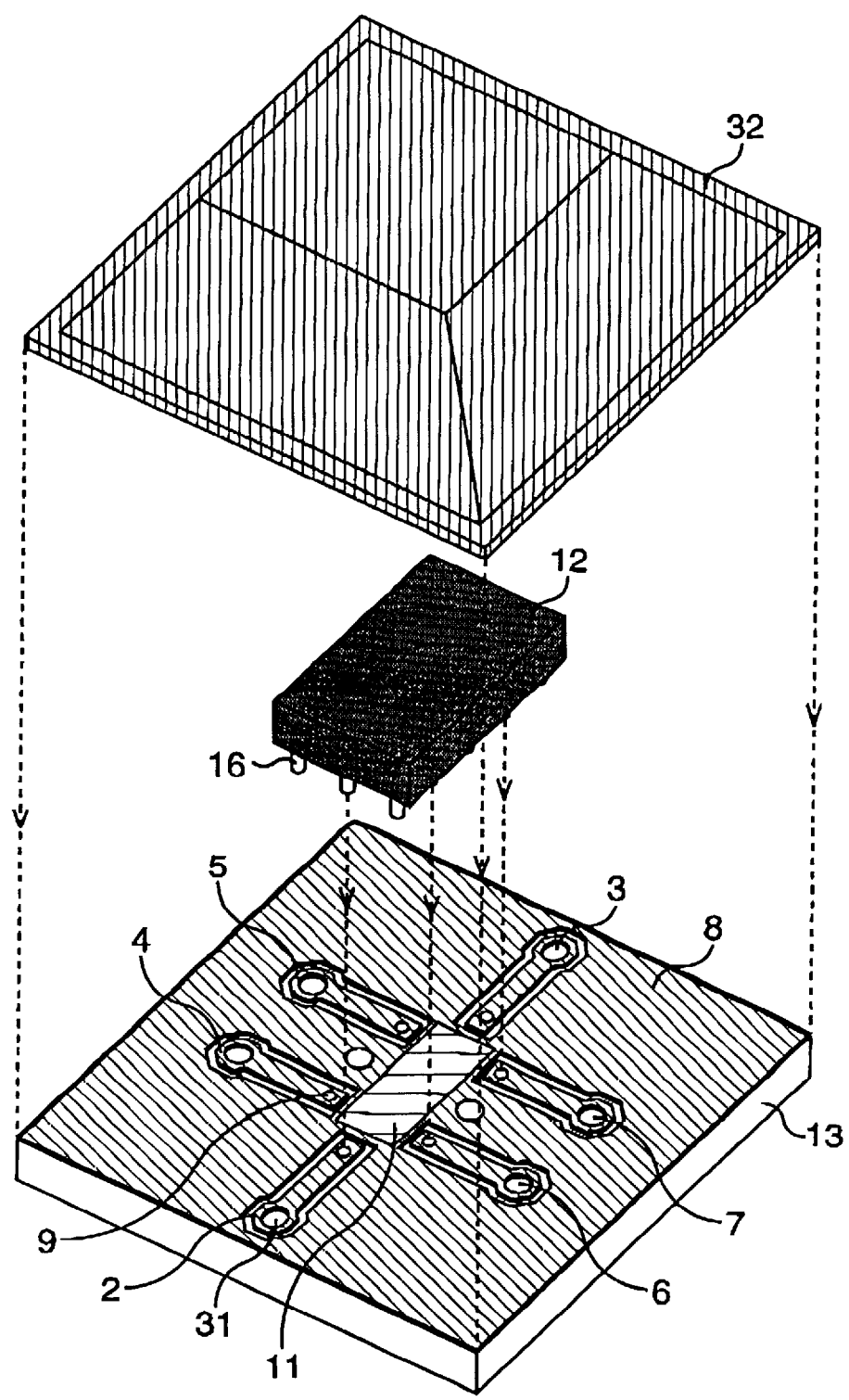
FIG. 10 is a schematic exploded perspective view of an integrated circuit package for flip-chip mounting according to the third embodiment of the present invention.
Figure 11:
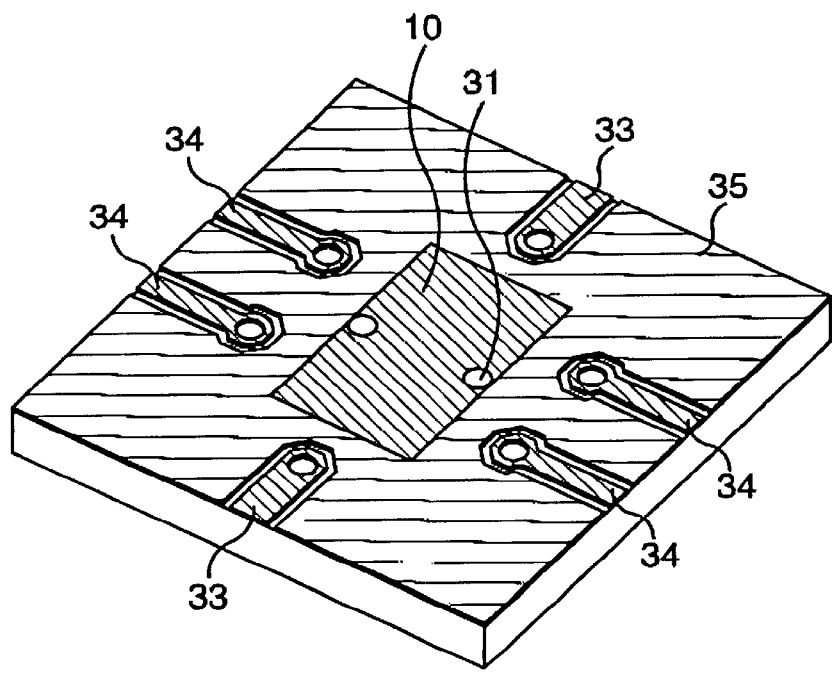
FIG. 11 is a schematic perspective view of the rear surface of a dielectric substrate of the integrated circuit package according to the third embodiment.
Figure 12:
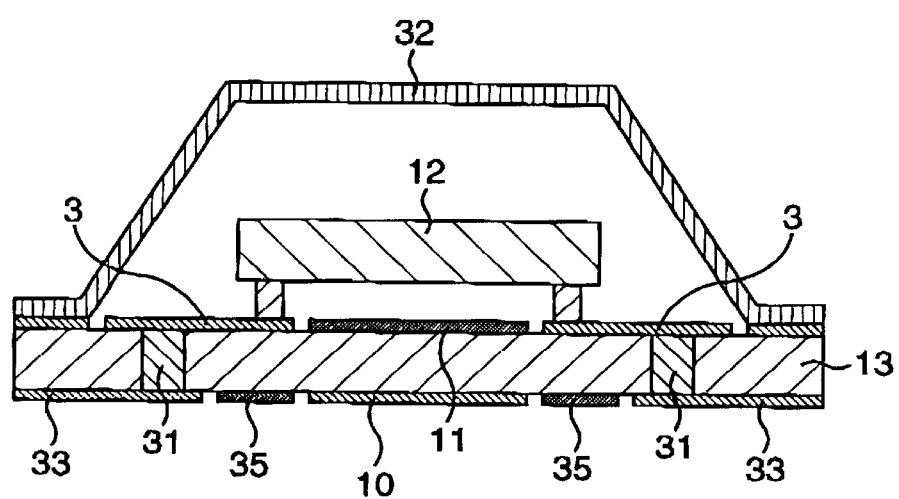
FIG. 12 is a schematic sectional view of the integrated circuit package according to the third embodiment.
Figure 13A:
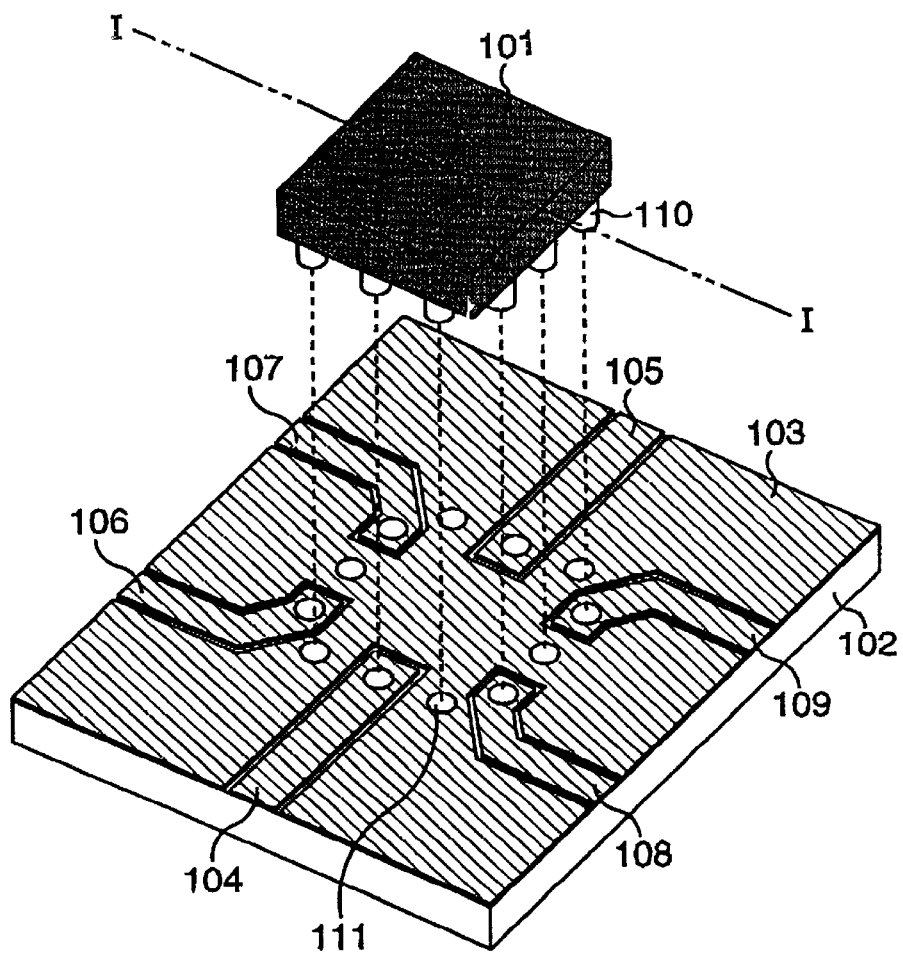
FIG. 13A is a schematic perspective view of a conventional integrated circuit package for flip-chip mounting.
Figure 13B:
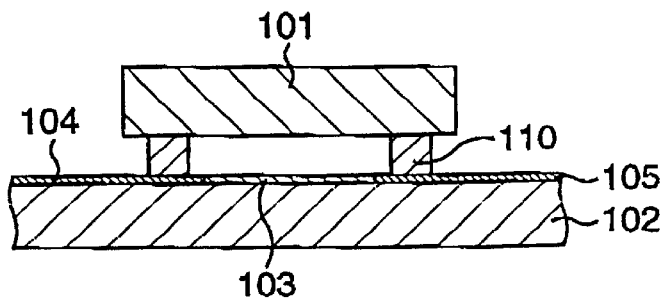
FIG. 13B is a schematic sectional view of the conventional integrated circuit package.
Figure 14A:
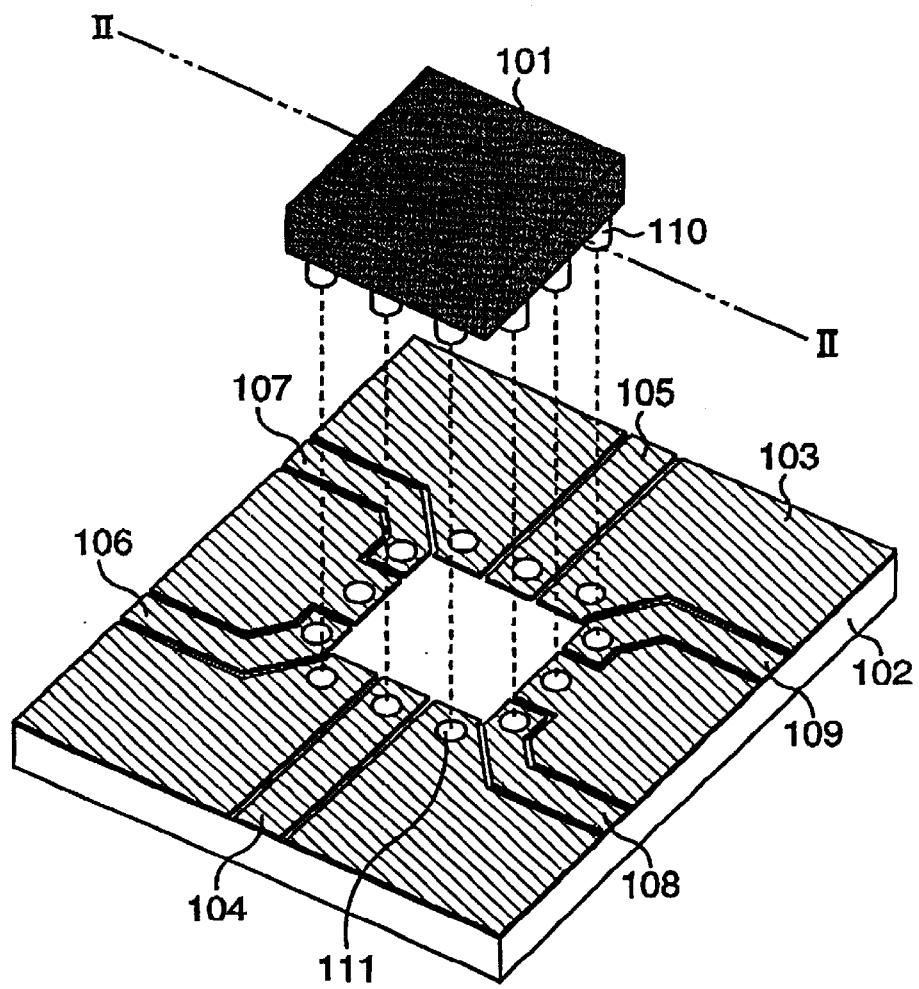
FIG. 14A is a schematic perspective view of another conventional integrated circuit package for flip-chip mounting.
Figure 14B:
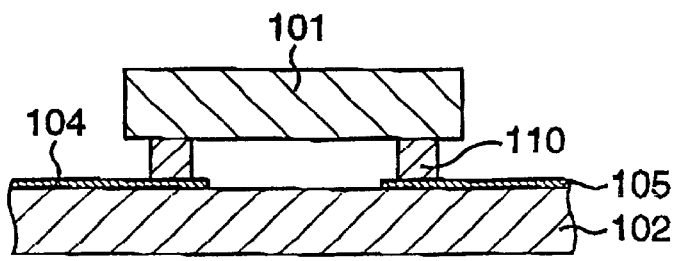
FIG. 14B is a schematic sectional view of the conventional integrated circuit package.

FIGS. 10 to 12 show the integrated circuit package according to this embodiment. FIG. 10 is an exploded perspective view thereof, FIG. 11 is a schematic perspective view showing the rear surface of a dielectric substrate and FIG. 12 is a schematic sectional view of the integrated circuit package.

The integrated circuit package is for flip-chip mounting an integrated circuit chip 12 which operates in a signal frequency of 76 GHz, and the structure of the upper surface of a dielectric substrate 1 with a thickness of about 200 $\mu$m to 400 $\mu$m is almost the same with that of the first embodiment. Incidentally, metallic pillars or structures of via holes filled with metal 31 for electrically connecting to the rear surface side are respectively formed in signal wirings 2, 3 and power supply wirings 4 to 7 which are provided near a resistance film 11 which is, for example, made of an alloy of nickel and chrome and has a film thickness of about 0.2 $\mu$m in such a manner to be electrically independent of the resistance film 11, and the signal wirings 2, 3 are connected to a rear surface wiring.

The signal wirings 2, 3 have coplanar structures so that transmission is performed in a mode which occurs between metals for grounding disposed on both sides thereof. In this case, for example, widths of the signal wirings 2, 3 are set to be about 60 $\mu$m and distances from ends of the wirings 2, 3 to a grounding conductor 8 are set to be about 40 $\mu$m. The power wirings 4 to 7 also have the coplanar structures, but these may take any forms as long as these have the structures in which the metals for grounding are placed around them since these are the wirings for power supply. It is preferable that a size of a diameter of the metallic pillar or the structure of the via hole filled with metal 31 is larger than half the thickness of the dielectric substrate 1, but any sizes may be suitable.

Further, a metallic cover 32 for protecting an integrated circuit and for preventing an entry of the electromagnetic wave from the outside is attached in such a manner to cover the upper surface of the dielectric substrate 1 onto the integrated circuit chip 12 which is flip-chip mounted. The metallic cover 32 is, for example, made of a material of an alloy of gold and tin.

Next, the structure of the rear surface of the dielectric substrate 1 will be explained.

As shown in FIG. 11, the rear surface of the dielectric substrate 1 is structured to include a signal wiring 33 for electrically connecting to the outside, a power wiring 34, the metallic pillars or the structures of the via holes filled with metal 31 which penetrate from the surface of the substrate to the rear surface, a resistance film 35 which is disposed to be electrically independent of the signal wiring 33 and the power wiring 34 and a metal for grounding 10 at a position right under the integrated circuit chip 12 which is flip-chip mounted (a part corresponding to the aforesaid opposed position).

According to this embodiment, in addition to the effects caused by the first embodiment, not only the electromagnetic wave emitted from the integrated circuit chip 12 which is flip-chip mounted can be absorbed in the resistance film 11 which is right under the chip, but also the resistance film 35 which is connected to the rear surface of the dielectric substrate 1 has an effect of absorbing the electromagnetic wave entering from the outside, thereby preventing the entry thereof into the integrated circuit.

What is claimed is:

1. An integrated circuit package comprising:
   a dielectric substrate having a rear surface with a grounding conductor and an upper surface with electric/electronic circuits including metallic film pattern; and
   an integrated circuit chip opposed to and connected with said dielectric substrate at the upper surface thereof,
   wherein said dielectric substrate has an electric resistance portion provided at the upper surface thereof, in an area opposed to said integrated circuit chip, that is electrically independent of said metallic film patterns.

2. The package according to claim 1,
wherein said opposed part of said dielectric substrate has a thickness corresponding to substantially a quarter of a predetermined signal wavelength.

3. The package according to claim 2,
wherein said signal wavelength is determined on the basis of a frequency used in an integrated circuit on said integrated circuit chip and the specific inductive capacity of said dielectric substrate.

4. The package according to claim 3,
wherein said opposed part of said dielectric substrate is uneven in thickness so that the thickness range of said opposed part includes thickness values respectively corresponding to substantially quarters of signal wavelengths.

5. The package according to claim 4,
wherein the thickness of said opposed part of said dielectric substrate varies continuously, and
wherein said electric resistance portion is provided in the region where said dielectric substrate is uneven in thickness.

6. The package according to claim 4,
wherein the thickness of said opposed part of said dielectric substrate varies discontinuously, and
wherein said electric resistance portion is provided in the region where said dielectric substrate is uneven in thickness.

7. The package according to claim 1,
wherein said opposed part of said dielectric substrate part has a thickness within the range from one eighth to a half of a signal wavelength determined on the basis of a frequency used in an integrated circuit on said integrated circuit chip and the specific inductive capacity of said dielectric substrate.

8. The package according to claim 7,
wherein said opposed part of said dielectric substrate is uneven in thickness so that the thickness range of said opposed part includes thickness values with said range, and
wherein said electric resistance portion is provided in the region where said dielectric substrate is uneven in thickness.

9. The package according to claim 8,
wherein the thickness of said opposed part of said dielectric substrate varies continuously, and
wherein said electric resistance portion is provided in the region where said dielectric substrate is uneven in thickness.

10. The package according to claim 8,
wherein the thickness of said opposed part of said dielectric substrate varies discontinuously, and
wherein said electric resistance portion is provided in the region where said dielectric substrate is uneven in thickness.

11. The package according to claim 1,
wherein said electric resistance portion has its surface resistance value substantially equal to the characteristic impedance between said electric resistance portion and said dielectric substrate.

12. The package according to claim 11,
wherein a gap is formed between said electric resistance portion and said dielectric substrate, and said surface resistance value of said electric resistance portion is substantially equal to the characteristic impedance of air.

13. The package according to claim 11,
wherein a gap formed between said electric resistance portion and said dielectric substrate is filled with a dielectric substance, and said surface resistance value of said electric resistance portion is substantially equal to the characteristic impedance of said dielectric substance.

14. The package according to claim 11,
wherein an insulation film is provided on said electric resistance portion, and a mesh-like metallic conductor is provided on said insulating film, said metallic conductor being electrically connected with an integrated circuit on said integrated circuit chip.

15. The package according to claim 1,
wherein said electric resistance portion is made by the manner that a groove formed in said opposed part of said dielectric substrate is filled with a resistance material.

16. The package according to claim 1,
wherein said dielectric substrate is further provided on its rear surface with another electric resistance portion that is electrically independent of its surroundings.

17. An integrated circuit package comprising:
a dielectric substrate having a rear surface with a grounding conductor and an upper surface with electric/electronic circuits including metallic film patterns; and
an integrated circuit chip opposed to and connected with said dielectric substrate, wherein said dielectric substrate has an electric resistance portion, in an area opposed to said integrated circuit chip, that is electrically independent of said metallic film patterns, and
the thickness of said dielectric substrate in said area is designed such that a predetermined signal wave to be absorbed by said electric resistance portion has its waveform open at the surface of said electric resistance portion.

18. The package according to claim 17,
wherein the thickness of said opposed portion of said dielectric substrate corresponds to substantially one-quarter the wavelength of said signal wave determined on the basis of a frequency used in an integrated circuit on said integrated circuit chip and the specific inductive capacity of said dielectric substrate.

19. The package according to claim 17,
wherein the thickness of said opposed part of said dielectric substrate has a value within the range from one-eighth to one-half the wavelength of said signal wave determined on the basis of a frequency used in an integrated circuit on said integrated circuit chip and the specific inductive capacity of said dielectric substrate.

20. The package according to claim 17,
wherein said electric resistance portion has its surface resistance value substantially equal to the characteristic impedance between said electric resistance portion and said dielectric substrate.

* * * * *